United States Patent
Baar et al.

(10) Patent No.: US 6,861,289 B2
(45) Date of Patent: Mar. 1, 2005

(54) MOISTURE-SENSITIVE DEVICE PROTECTION SYSTEM

(75) Inventors: James C Baar, Logansport, IN (US); Michael W Blazier, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 287 days.

(21) Appl. No.: 10/202,988

(22) Filed: Jul. 25, 2002

(65) Prior Publication Data

US 2004/0018665 A1 Jan. 29, 2004

(51) Int. Cl.[7] .............................................. H01L 21/48
(52) U.S. Cl. .................................... 438/115; 438/118
(58) Field of Search .............................. 438/115, 118, 438/121, 124, 125, 126

(56) References Cited

U.S. PATENT DOCUMENTS

| | | | |
|---|---|---|---|
| 4,797,605 A | 1/1989 | Palanisamy | |
| 4,970,122 A | 11/1990 | Palanisamy | |
| 5,755,026 A | 5/1998 | Stephan et al. | |
| 5,968,386 A | 10/1999 | Goenka et al. | |
| 6,074,891 A | 6/2000 | Staller | |
| 6,103,141 A * | 8/2000 | Incorvia et al. | 252/194 |
| 6,332,536 B2 | 12/2001 | Easton | |
| 6,543,246 B2 * | 4/2003 | Wayburn et al. | 62/259.2 |
| 6,555,856 B1 | 4/2003 | Staller | |
| 6,594,916 B2 * | 7/2003 | Boroson et al. | 34/335 |
| 2002/0183431 A1 * | 12/2002 | Kawaguchi et al. | 524/394 |

* cited by examiner

Primary Examiner—T. N. Quach
(74) Attorney, Agent, or Firm—Stefan V. Chmielewski

(57) ABSTRACT

Integrated circuit moisture resistant apparatuses (10) are provided for preventing moisture absorption by an integrated circuit (24). The moisture resistant apparatuses include at least one integrated circuit housing (12) that has a plurality of inner walls (18), which form at least one inner cavity (28). A desiccant body (30) is coupled to at least a portion of the plurality of inner walls (18) and absorbs moisture within the inner cavity (28). A method for performing the same is provided. Also, a manufacturing method of preventing moisture absorption by the integrated circuit (24) is provided.

20 Claims, 2 Drawing Sheets

MOISTURE-SENSITIVE DEVICE PROTECTION SYSTEM

TECHNICAL FIELD

The present invention relates generally to integrated circuits, and more particularly, to apparatuses and methods of extending the life of moisture-sensitive devices.

BACKGROUND OF THE INVENTION

Integrated circuits (ICs) are commonly used in various electronic systems, including computer-based systems, logic based systems, control systems, and other systems known in the art. During production and manufacturing of these systems, ICs may remain unused (e.s. in inventory) for extended periods of time, where they can be exposed to environmental conditions, such as, humidity and moisture. The moisture typically can be in the form of water vapor in air. Exposure to moisture typically can occur during production downtime, for example, during production "change-overs" or during small quantity production of an electronic system, where continuous production is not required. Of course, exposure to the elements, such as moisture, may also occur during other production downtime events, which are experienced in conventional manufacturing and assembly operations.

Each IC includes a silicon device within a mold, typically formed of a plastic material. Each IC has a corresponding moisture sensitivity level with an associated maximum exposure time. The sensitivity levels and exposure times, as well as, staying the maximum exposure time, have associated industry standard requirements. When an IC has exceeded an industry standard requirement, the IC is typically discarded or baked for an extended period of time. Discarding of ICs, causes wasted expense and baking of ICs can have associated disadvantages, as stated in detail below.

A typical series of manufacturing steps, for an electronic system, stated above, are as follows. First, a tape reel or tray of ICs is removed from an airtight moisture barrier bag, for use in an assembly machine. Once the bag is opened to begin manufacturing, the components have a limited useful life. Next, The ICs are placed onto a printed circuit board having a solder paste pattern to form an electronic system assembly. Finally, the electronic system assembly is placed into a reflow oven, to melt the solder and form solder bonds between the ICs and the printed circuit board.

ICs that have been exposed for extended periods of time to levels of moisture typically found in air at most production and manufacturing facilities, are vulnerable to internal damage when processed in a reflow oven. This vulnerability requires special handling methods that increase manufacturing costs.

When an IC is exposed to moisture, a moisture permeating process begins. Moisture penetrates into the mold and gradually reaches a center cavity, where the IC resides therein. When the IC is baked, due to the moisture level of the molding compound, delamination of mold from the silicon device can occur, with consequent breaking of wire bonds. The broken wire bonds cause intermittence during post assembly operating use of the IC. Although ICs are tested upon completion of assembly before being used as intended, the delamination may be undetectable, since the silicon device wire bonds may be resting on or touching silicon device contacts even though a wire bond no longer exists.

An IC maximum exposure time can be stayed using several methods. A first method includes placing the IC in a "Dry Box", which prevents further exposure to moisture, during downtime. A disadvantage with the dry box is that the moisture that previously entered the IC, remains in the IC, which may cause operating intermittence. Also, potential future industry standards, prohibiting the use of dry-boxes, may be introduced due to the potential associated intermittence. Another method includes baking the IC for a period of time to remove moisture that has entered the mold. By baking the IC, the moisture penetration process is reversed. Obviously, this baking is time consuming, not cost effective, and can cause oxydation of solder coating on IC leads, degrading the ability to have a solder joint formed to the IC. As another method, the ICs can be reinserted into moisture barrier bags, during downtime, although is also time consuming and requires a supply of moisture barrier bags and desiccant material, as well as a sealing apparatus.

It would therefore be desirable to develop a method of reducing the amount of moisture exposure of ICs during manufacturing and production processes, which does not require special handling and is cost effective.

SUMMARY OF THE INVENTION

The present invention provides apparatuses and methods of extending the life of moisture-sensitive devices. Integrated circuit moisture resistant apparatuses are provided for preventing moisture absorption by an integrated circuit. The moisture resistant apparatuses include at least one integrated circuit housing that has a plurality of inner walls, which form at least one inner cavity. A desiccant body is coupled to at least a portion of the plurality of inner walls and absorbs moisture within the inner cavities. A method for performing the same is provided. Also, a manufacturing method of preventing moisture absorption by an integrated circuit is provided.

One of several advantages of the present invention is that it provides a desiccant body within the integrated circuit housing, which absorbs moisture within the inner cavity. The presence of the desiccant body within the integrated circuit housing prevents absorption of moisture by an integrated circuit mold. This increases the floor life of the integrated circuits.

Another advantage of the present invention is that it is versatile in application. It may be applied to multiple style integrated circuits and integrated circuit housings and may be applied using multiple methods.

Furthermore, the present invention provides multiple methods of preventing moisture absorption of an integrated circuit mold that consumes a minimal amount of time and is cost effective.

Other advantages and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
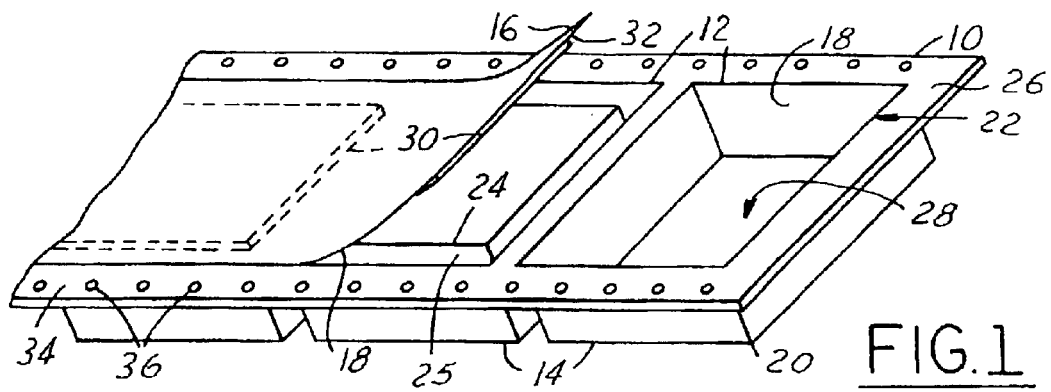
FIG. 1 is a perspective view of a first integrated circuit moisture resistant apparatus in accordance with an embodiment of the present invention.

In each of the following figures, the same reference numerals are used to refer to the same components. While the present invention is described with respect to methods and apparatuses for preventing moisture absorption by an integrated circuit, the present invention may be applied in various manufacturing and production processes. It is also understood that the present invention may be applied in assembly of various systems including: electronic systems, control systems, computer-based systems, logic-based systems, and other systems known in the art.

In the following description, various operating parameters and components are described for one constructed embodiment. These specific parameters and components are included as examples and are not meant to be limiting.

Figure 2:
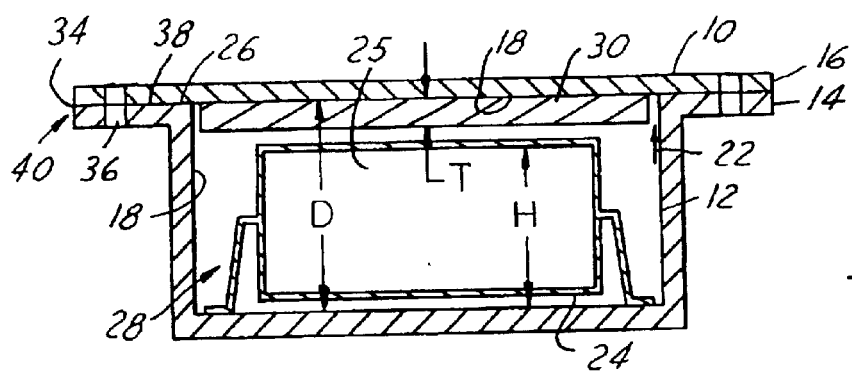
FIG. 2 is a cross-sectional view of the first integrated circuit moisture resistant apparatus in accordance with an embodiment of the present invention.
Figure 3:
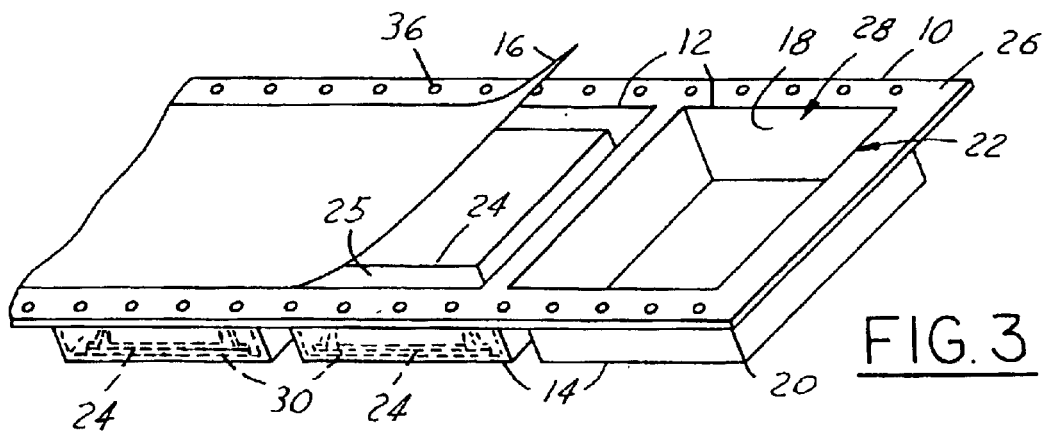
FIG. 3 is a perspective view of a second integrated circuit moisture resistant apparatus in accordance with an embodiment of the present invention.
Figure 4:
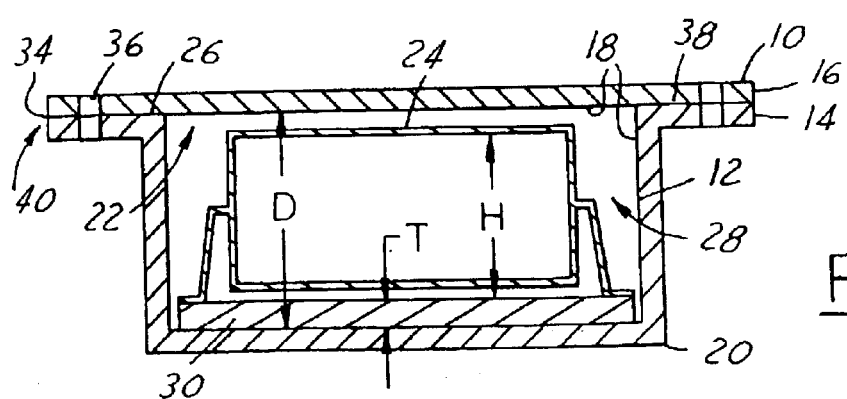
FIG. 4 is a cross-sectional view of the second integrated circuit moisture resistant apparatus in accordance with an embodiment of the present invention.

Referring now to FIGS. 1–4, perspective views and cross-sectional views of integrated circuit moisture resistant apparatuses 10, are shown, in accordance with an embodiment of the present invention. The moisture resistant apparatuses 10 include at least one housing 12, where each housing 12 has a lower portion 14 and an upper portion 16. The lower portion 14 has multiple inner walls 18 that form an integrated circuit pocket 20. The pocket 20 has an open side 22 for an integrated circuit 24 to be inserted and removed therethrough. The integrated circuit 24 has an integrated circuit mold 25. The upper portion 16 is coupled to an upper side 26 of and forms an inner cavity 28 with the lower portion 14. A desiccant body 30 is coupled to the housing 12 and resides within the inner cavity 28. In one embodiment of the present invention, as illustrated in FIGS. 1 and 2, the desiccant body 30 is coupled to an inner side 32 of the upper portion 16. In another embodiment of the present invention, as illustrated by FIGS. 3 and 4, the desiccant body 30 is coupled to the lower portion 14.

Although, the moisture resistant apparatuses 10 of FIGS. 1 and 3 are shown in the form of a tape, having flanges 34 and flange holes 36, which may be wound onto a reel, the moisture resistant apparatuses 10 may be of various forms. For example, the moisture resistant apparatuses 10 may be in the form of integrated circuit reels, integrated circuit trays, or other forms known in the art.

The housing 12 may also be in various forms, styles, shapes, and sizes known in the art. The housing 12, including the inner walls 18, may be formed of a plastic moisture permeable material, as traditionally used or may be formed of a moisture impermeable or moisture resistant material. The moisture resistant material aids in preventing moisture from entering the inner cavity 28 and potentially being absorbed by an integrated circuit mold. The inner walls 18 may form or be integrally part of an integrated circuit tape, as shown.

The lower portion 14 and the upper portion 16 may also be in a form of an integrated circuit tape, as shown. The upper portion 16 covers the open side 22 and is coupled to the lower portion 14 by a sealant layer 38, which forms a seal 40. The sealant layer 38 may be in the form of an adhesive or other sealant material known in the art. Alternatively, the seal 40 may include a weld, known in the art as a heat seal, of upper portion 16 to lower portion 14, in which case no additional sealant material is required. The seal 40 prevents moisture from entering the inner cavity 28 through the seal 40.

The pocket 20 has a depth D that accommodates a desiccant body thickness T and an integrated circuit height H. The depth D varies depending upon integrated circuit type and style and desiccant body thickness T.

The desiccant body 30 may be of various forms including: a desiccant layer, a desiccant coating, a desiccant wafer, desiccant film, a desiccant paper, a desiccant tape, a desiccant material, a desiccant deposit, or other desiccant body known in the art. Examples of desiccant paper and desiccant tape are Drikette® Desiccant Paper and Desimax™ Sorbent Loaded Film Desiccant Tape, respectively, by Multisorb Technologies Inc. In one embodiment of the present invention the desiccant body 30 is formed of cellulose fiber and silica gel. The desiccant body 30 may be of various styles, shapes, sizes, and forms.

The desiccant body 30, in absorbing moisture within the inner cavity 28, increases allowable exposure time to air and moisture of the housing 12, containing the integrated circuit 24. The desiccant body 30, therefore, minimizes a potential need to bake the integrated circuit 24 to reverse moisture saturation thereof. Thus, the desiccant body 30 also minimizes the potential for delamination of integrated circuit wire bonds within the mold 25.

Figure 5:
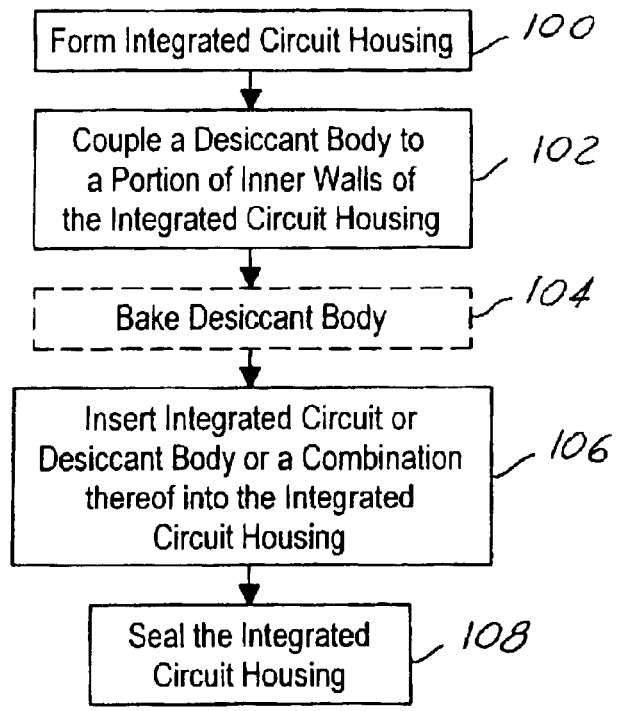
FIG. 5 is a logic flow diagram illustrating a method of preventing moisture absorption by an integrated circuit in accordance with an embodiment of the present invention.

Referring now to FIG. 5, a logic flow diagram illustrating a method of preventing moisture absorption by the integrated circuit 24 in accordance with an embodiment of the present invention is shown.

In step 100, the housing 12 is formed, including the inner walls 18 to form the inner cavity 28. The housing 12 may be formed using methods known in the art. The housing 12 may be in the form of a tape, a tray, a cartridge, or other integrated circuit housing form. The housing 12 may be formed of moisture impermeable material, unlike integrated circuit housings of prior art. The moisture impermeable material, as stated above, prevents moisture from entering the inner cavity 28 and potentially being absorbed by the integrated circuit mold 25.

In step 102, a desiccant body 30 is coupled to a portion of the inner walls 18 or a portion of the integrated circuit 24. The desiccant body 30 may be inserted into the inner cavity 28, as shown by FIGS. 3 and 4, or applied to an inner wall 18, as shown by FIGS. 1 and 2. The desiccant body 30 may also be applied or attached to the integrated circuit 24 before being inserted into the inner cavity 28. The desiccant body 30 may be molded onto, applied to, adhesively attached to, or coupled to a portion of the inner walls 18, the integrated circuit 24, or a combination thereof.

In step 104, the housing 12 or the integrated circuit 24 and the desiccant body 30 may be baked, using baking methods known in the art, upon application of the desiccant body 30 to the inner walls 18, to activate the desiccant body 30 by removing absorbed moisture from the desiccant body 30.

In step 106, the integrated circuit 24 as well as the desiccant body 30, when attached to the integrated circuit 24, is inserted into the inner cavity 28.

In step 108, the housing 12 is sealed. The lower portion 14 is sealed to the upper portion 16. The lower portion 14 may be sealed to the upper portion 16 via the sealant layer 38, an adhesive, by negatively pressurizing the inner cavity 28, by a mechanical coupling, or by other sealing methods known in the art. In sealing the upper portion 16 to the lower portion 14 further prevents moisture from entering the inner cavity 28, and potentially the integrated circuit 24.

Figure 6:
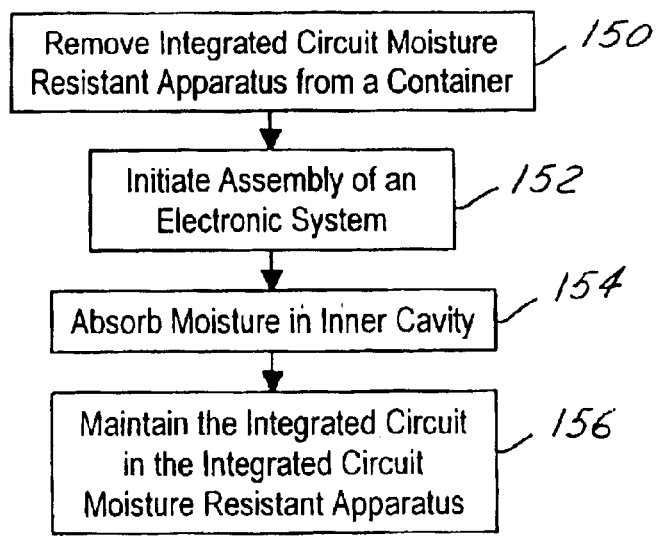
FIG. 6 is a logic flow diagram illustrating a manufacturing method of preventing moisture absorption by an integrated circuit in accordance with an embodiment of the present invention.

Referring now to FIG. 6 a logic flow diagram illustrating a manufacturing method of preventing moisture absorption by the integrated circuit 24 in accordance with an embodiment of the present invention is shown.

In step 150, the integrated circuit moisture resistant apparatuses 10 are removed from a container. The container may be an airtight moisture resistant bag or other container or storage device known in the art.

In step 152, assembly of an electronic system is initiated. The integrated circuit moisture resistant apparatuses 10 enter an electronic system assembly machine, where upon the integrated circuit 24 may remain in the housing 12 or may be attached to a printed circuit board, not shown.

In step 154, when the integrated circuit 24 remains in the housing 12, moisture is absorbed in the inner cavity 28 by the desiccant body 30, thereby preventing moisture absorption by the integrated circuit mold 25.

In step 156, the integrated circuit 24 is maintained in the integrated circuit moisture resistant apparatuses 10 until assembly usage thereof. During assembly of the electronic system, during downtime, or during other times when the integrated circuit 24 is not being attached to a printed circuit board or other electronic device, the integrated circuit 24 remains in the housing 12 to prevent moisture absorption by the integrated circuit mold 25.

The above-described steps, in FIGS. 5 and 6, are meant to be an illustrative example, the steps may be performed synchronously or in a different order depending upon the application.

The present invention provides multiple methods and apparatuses for preventing moisture absorption by an integrated circuit mold. The present invention, by minimizing the moisture absorption of an integrated circuit, minimizes future operating intermittence and increases the life of the integrated circuit. The present invention also does not require the use of a dry-box during assembly, or downtime, of an electronic system due to the moisture absorption characteristics of the integrated circuit moisture resistant apparatuses. Moreover, the present invention minimizes the need to bake the integrated circuit, thereby minimizing problems associated therein.

The above-described apparatus, to one skilled in the art, is capable of being adapted for various purposes and is not limited to the following systems: electronic systems, control systems, computer-based systems, logic-based systems, and other systems known in the art. The above-described invention may also be varied without deviating from the spirit and scope of the invention as contemplated by the following claims.

What is claimed is:

1. A method of preventing moisture absorption by an integrated circuit comprising:
    forming an integrated circuit housing comprising a plurality of inner walls forming an inner cavity;
    coupling a desiccant body to at least a portion of said plurality of inner walls; and
    inserting and storing the integrated circuit in said inner cavity until assembly usage thereof.

2. A method as in claim 1 further comprising sealing said integrated circuit housing.

3. A method as in claim 2 wherein sealing said integrated circuit housing comprises adhesively attaching a lower portion to an upper portion of said integrated circuit housing.

4. A method as in claim 1 further comprising preventing moisture from entering said inner cavity.

5. A method as in claim 1 further comprising forming said plurality of inner walls of moisture impermeable material.

6. A method as in claim 1 wherein coupling said desiccant body to at least a portion of said plurality of inner walls comprises applying a desiccant material to at least a portion of said inner walls.

7. A method as in claim 6 further comprising baking said desiccant body to remove absorbed moisture in said desiccant body.

8. A method as in claim 1 wherein said desiccant body is formed from cellulose fiber and silica gel.

9. A method of preventing moisture absorption by an integrated circuit comprising:
    forming an integrated circuit housing comprising a plurality of inner walls forming an inner cavity;
    coupling a desiccant body to at least a portion of the integrated circuit; and
    inserting the integrated circuit and said desiccant body in said inner cavity.

10. A method as in claim 9 further comprising sealing said integrated circuit housing.

11. A method as in claim 10 wherein sealing said integrated circuit housing comprises adhesively attaching a lower portion to an upper portion of said integrated circuit housing.

12. A method as in claim 9 further comprising preventing moisture from entering said inner cavity.

13. A method as in claim 9 further comprising forming said plurality of inner walls of moisture impermeable material.

14. A method as in claim 9 further comprising baking said desiccant body to remove absorbed moisture in said desiccant body.

15. A manufacturing method of preventing moisture absorption by an integrated circuit comprising:
    removing an integrated circuit moisture resistant apparatus from a container;
    initiating assembly of an electronic system;
    absorbing moisture in an inner cavity of said integrated circuit moisture resistant apparatus; and
    maintaining the integrated circuit in said integrated circuit moisture resistant apparatus until assembly usage thereof.

16. A method as in claim 15 wherein absorbing moisture in an inner cavity of said integrated circuit moisture resistant apparatus comprises absorbing moisture via a desiccant body.

17. A method as in claim 15 wherein absorbing moisture in an inner cavity of said integrated circuit moisture resistant apparatus comprises absorbing moisture via a desiccant body contained and stored therein.

18. A method as in claim 15 wherein absorbing moisture in an inner cavity of said integrated circuit moisture resistant apparatus comprises absorbing moisture via a desiccant body coupled to the integrated circuit.

19. A method as in claim 15 wherein absorbing moisture in an inner cavity of said integrated circuit moisture resistant apparatus comprises preventing moisture absorption by the integrated circuit.

20. A method as in claim 15 wherein maintaining the integrated circuit in said integrated circuit moisture resistant apparatus until assembly usage thereof comprises maintaining the integrated circuit in said integrated circuit moisture resistant apparatus until the integrated circuit is attached to an electronic device.

* * * * *